United States Patent
Wang et al.

[11] Patent Number: 5,679,606
[45] Date of Patent: Oct. 21, 1997

[54] METHOD OF FORMING INTER-METAL-DIELECTRIC STRUCTURE

[75] Inventors: Chin-Kun Wang, San-Chung; Chen-Hua Douglas Yu, Keelung; Lu-Min Lin, Hsin-Chu, all of Taiwan

[73] Assignee: Taiwan Semiconductor Manufacturing Company, Ltd., Hsin-Chu, Taiwan

[21] Appl. No.: 579,518

[22] Filed: Dec. 27, 1995

[51] Int. Cl.$^6$ .................................. H01L 21/316
[52] U.S. Cl. ...................... 437/195; 437/238; 437/978
[58] Field of Search ............................. 437/195, 235, 437/238, 240, 24, 978; 257/760

[56] References Cited

U.S. PATENT DOCUMENTS

| | | | |
|---|---|---|---|
| 4,492,620 | 1/1985 | Matsuo et al. | 204/192 |
| 4,732,761 | 3/1988 | Machida et al. | 437/228 |
| 4,778,620 | 10/1988 | Goto et al. | 252/299.63 |
| 4,962,063 | 10/1990 | Maydan et al. | 437/228 |
| 5,079,188 | 1/1992 | Kawai | 437/195 |
| 5,124,014 | 6/1992 | Foo et al. | 204/192.32 |
| 5,518,962 | 5/1996 | Murao | 437/195 |

FOREIGN PATENT DOCUMENTS

502647A2  9/1992  European Pat. Off. .

OTHER PUBLICATIONS

"Improved Sub-Micron Inter-Metal Dielectric Gap Filling Using TEOS/Ozone APCVD" by E.J. Korczyski et al, Microelectronics, Jan. 1992, pp. 22-27.

Wolf, S., et al., Silicon Processing, vol. 1, Lattice Press, 1986, pp. 182-185, 191-195, 331-334, 399-400.

*Primary Examiner*—T. N. Quach
*Attorney, Agent, or Firm*—George O. Saile; Stephen B. Ackerman; William J. Stoffel

[57] ABSTRACT

A process for forming an planar dielectric layer over metallurgy lines using an in situ multi-step electron cyclotron resonance (ECR) oxide deposition process. A substrate with metallurgy lines on its surface is covered with a protective ECR oxide layer. The novel ECR process for the protective layer does not have an argon flow and does not etch the surface (e.g., metal lines) it is deposited upon. Next, a gap-fill step is formed over the protective layer. The gap-fill step uses Argon flow and rf power to enhance the deposition in gaps and the planarization. The gap-fill layer etches the underlying protective layer but the protective layer prevents the gap-fill deposition/etch process from attacking and damaging the metallurgy lines. Next, the protective layer and the gap-fill layer sequence are repeated until the desired thickness is obtained. A thick capping protective layer and a capping gap-fill layer are used to complete the planarization process. This multi-step in situ process permits the use of the corrosive Gap-fill ECR process which can fill between closely spaced metallurgy lines without damaging the lines.

31 Claims, 3 Drawing Sheets

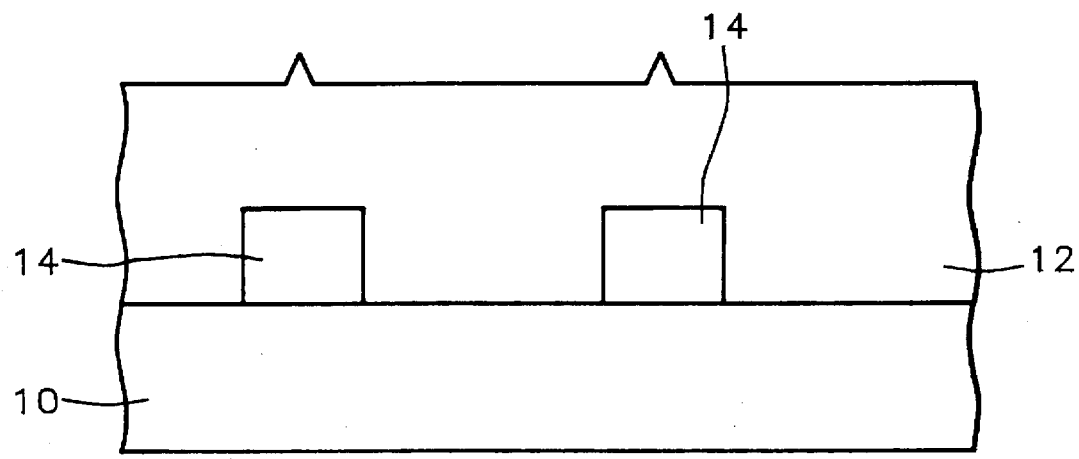
FIG. 1 – Prior Art
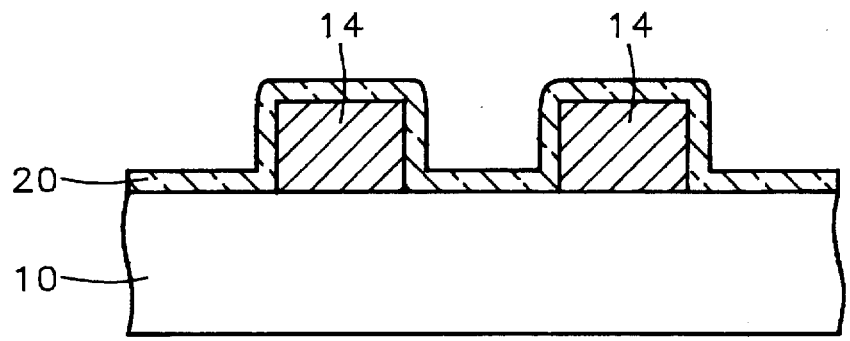
FIG. 2
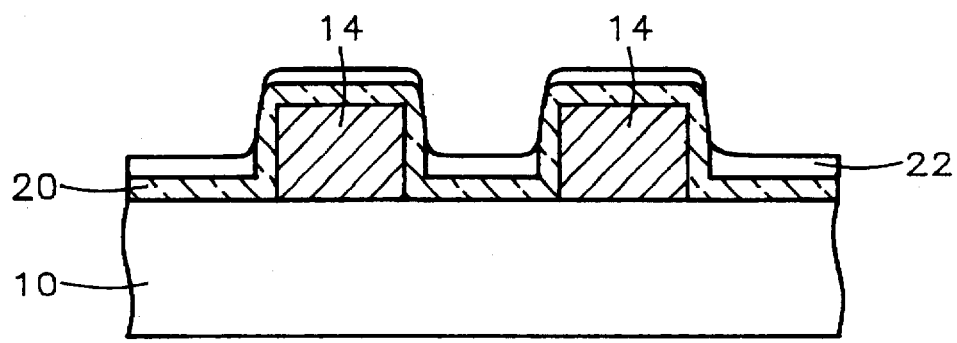
FIG. 3

METHOD OF FORMING INTER-METAL-DIELECTRIC STRUCTURE

BACKGROUND OF THE INVENTION

1. Field of the Invention

This invention relates to a structure and process for an inter metal dielectric layer for integrated circuit manufacturing. More particularly, this invention relates to a structure and process for inter metal dielectric layers formed using an electron cyclotron resonance processes and high density plasma chemical vapor deposition (CVD) processes.

2. Description of the Prior Art

In the conventional formation of conductive layers in an integrated circuit, a metal layer is deposited and patterned by conventional lithography and etching techniques to form metal lines/patterns, thus creating an uneven surface. Then a layer of insulating material, such as silicon oxide, is applied over the metal lines to electrically insulate the metal lines from each other and to permit the formation of further patterned layers thereover.

It is often desirable for the insulating layer to be so formed that the upper surface of the insulating layer is planar over an extended region, irrespective of whether individual portions of the upper surface overlie metal lines or contacts or the spaces between such lines/contacts. The formation of such an insulating layer having a planar upper surface is referred to as planarization.

Various processes are available for forming insulating layers. However, only processes involving relatively low temperatures are useful for planarizing metal contacts since metal contacts are typically made of aluminum. Aluminum contacts are intolerant of processing temperatures greater than about 400° C. because at such temperatures hillocks tend to form in aluminum films.

Plasma deposition processes are of interest in this regard, because they are able to form insulating layers of silicon dioxide or silicon nitride at relatively low temperatures. In particular, high density plasma (HDP) processes, such as electron cyclotron resonance (ECR) processes and induced coupling plasma (ICP)) processes have been found to produce high-quality silicon dioxide and silicon nitride layers without heating the substrate to more than about 300° C.

Moreover, it is desired to planarize submicron interconnections having high aspect ratios, such as are used in VLSI manufacturing. Insulating films can be formed using high density plasma deposition since these oxides can fill-in small geometry volumes better than conventional oxides.

FIG. 1 shows a process for forming and planarizing an insulating layer 12 over metal lines according to the prior art process. Raised portions 14, e.g., metal lines, are formed on an integrated circuit structure 10. Integrated circuit structure 10 can be a semiconductor wafer including layers formed in and on the wafer. An insulating layer 12, which may be formed of silicon oxide, is formed over the raised portions 14 and the integrated circuit structure 10. Insulating layer 12 composed of silicon oxide may be formed by high density plasma deposition, such as induce coupling plasma (IDP) or electron cyclotron resonance (ECR) oxide plasma deposition as described in U.S. Pat. No. 4,962,063, Maydan et al.

The conventional process has a major drawback in that the high density plasma (HDP) deposition of the ECR oxide insulating layer 12 often damages the underlying circuit elements 14, especially metal lines. High density plasma (HDP) sources employ magnetic fields and microwave power to create chemically active plasmas, preferably at very low gas pressures. It is difficult to control the energy transferred to the reactant ions in the plasma deposition. The high density plasma (HDP) chemical vapor deposition (CVD) process (e.g., ECR) is an in situ sputtering and deposition process using an argon flow, high microwave power and RF power. The metal lines on the wafers are subjected to in situ sputtering which creates a damaging "antenna effect". The higher microwave power generates higher ion energy which increases the damage to the metal lines. The high power during the ECR oxidation process creates transconductance (i.e., gin) degradation due to the Fowler-Nordheim (F-N) tunneling stress.

Therefore, there is a need to create a structure and process whereby the damage to semiconductor devices, e.g., metal lines, from high density plasma (e.g. HDP and ECR) deposition of insulating layer is significantly reduced or eliminated.

Matsuo et al, U.S. Pat. No. 4,962,620, Goto, U.S. Pat. No. 4,778,620, and Maydan, U.S. Pat. No. 4,962,063 show methods and equipment for ECR deposition of dielectric layers. The article "Improved Sub-micron Inter-metal Dielectric Gap-filling Using TEOS/OZONE APCVD" by E. J. Korczyski et al, published in the Microelectronics, January 1992 pp. 22–27 provides a comparison of ECR and TEOS/O3 planarization methods.

SUMMARY OF THE INVENTION

It is an object of the present invention to provide a method of forming an inter metal dielectric layer that will reduce the damage caused by high density plasma (HDP) deposition of insulating layers.

It is another object of the present invention to provide a method of forming an inter-metal dielectric layer that will reduce the damage to conductive lines caused by electron cyclotron resonance deposition of silicon oxide insulating layers.

In accordance with the above objectives, an in situ multi step process for forming an inter-metal-dielectric layer of an integrated circuit structure that reduces damage caused by electron cyclotron resonance deposition of insulating layers is provided.

Closely spaced metallurgy lines are formed on a semiconductor substrate. Next, the substrate and the metallurgy lines are encapsulated with a protective oxide layer. The protective oxide layer is formed by an electron cyclotron resonance (ECR) technique with no argon flow which greatly reduces the etching action of the ECR process. This protective layer does not attack the metallurgy lines and shields the metallurgy lines from attack from the subsequent ECR depositions of "gap filling layers".

A gap-fill oxide layer is then formed over the protective layer. The gap filled oxide layer is formed by an ECR oxide technique with an argon flow and a rf power. The ECR oxide technique used to form the gap fill layer involves an etching and deposition process where the etch rate is a function of the surface angle, the argon flow rate and the rf power. The gap fill ECR process is set to so that the layer fills in between the lines, but does not etch through the protective layer. The gap-fill layer does not expose the metallurgy lines. The layer is called a gap fill layer because the ECR parameters are set such that the layer can fill between closely spaced metallurgy lines with forming voids.

Next, the protective layer and gap fill layer steps are repeated until the desired thickness of the gap fill layers and the protective layers are formed. Subsequently, a capping gap fill layer 26 having a thickness in the range between about 5000 to 10,000 Å and more preferably about 7500 Å is formed as shown in FIG. 5. Next, a capping protective layer 28 preferably having a thickness in the range between about 8000 to 12,000 Å and more preferably about 10,000 Å is formed. The capping gap fill layer and protective layer planarize the layers. Next, additional metallurgy layer and insulating layer can be formed over the capping layer and the metallurgy lines connected to form a semiconductor device.

The in situ multi step process of the invention forms dielectric oxide layers between closely spaced lines without damaging the metallurgy lines. The process is inexpensive, simple to implement and increases device yields.

BRIEF DESCRIPTION OF THE DRAWINGS

The drawings show the following:

FIG. 1 is a schematic sectional view for explaining a conventional prior art process for forming an ECR oxide layer over metal lines.

FIGS. 2 through 5 are schematic sectional views for explaining the process of the current invention for an low damage in situ multi-step ECR deposition which does not damage metallurgy lines.

DETAILED DESCRIPTION OF THE PREFERRED EMBODIMENTS

Figure 4:
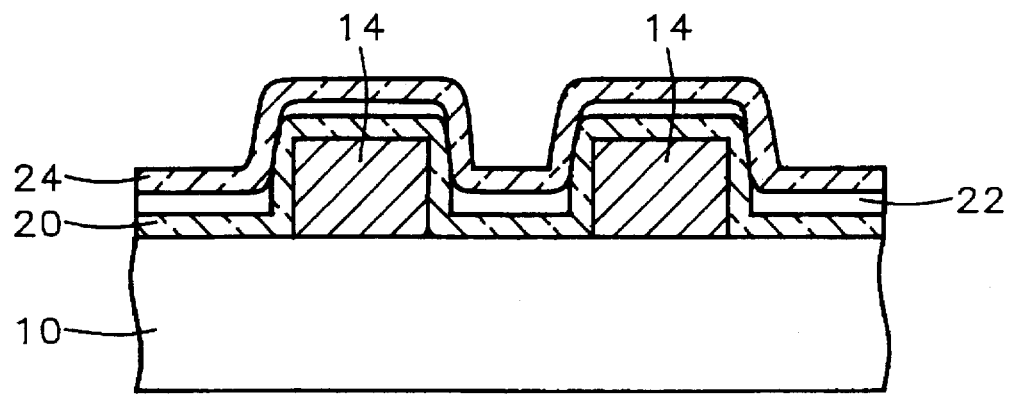

The present invention will be described in detail with reference to the accompanying drawings. It should be noted that the drawings are in greatly simplified form. In practice the semiconductor device structure will be one of many supported on a common substrate connected with suitable metallurgy in various electronic electric circuit configurations.

As shown in FIG. 2, the integrated circuit structure 10 has metallurgy liens 14 on the surface of the structure that are higher than adjacent sections of the structure surface. The metallurgy lines can be formed of a tungsten interconnect, AlSiCu and AlCu. The metallurgy lines are preferably formed of AlCu. The metallurgy lines can have a thickness in the range between about 0.3 to 0.5 μm and more preferably about 5,000 Å. The metal lines can have a width in the range between about 0.3 to 0.5 μm and more preferably about 0.4 μm. The spacing between the metal lines can preferably be in the range between about 0.3 to 0.5 and more preferably about 0.4 μm.

The metallurgy lines 14 can optionally be covered with a titanium nitride layer (not shown) having a thickness in the range between about 750 to 1,400 Å and more preferably about 1200 Å.

Next, the substrate 10 and the metallurgy lines 14 are encapsulated with a protective oxide layer 20 as shown in FIG. 2. The protective oxide layer 20 is formed by an electro cyclotron resonance technique with no argon flow. The protective layer 20 does not attack or etch the metallurgy lines because the argon flow is off. The protective layer has a thickness in the range between about 1000 to 2000 Å and more preferably about 1500 Å.

The novel protective layer 20 can be formed of silicon oxide, doped silicon dioxide, silicon nitride or silicon oxynitride using ECR process without argon flows. The protective layer 20 is preferably formed of silicon dioxide. A protective layer composed of silicon oxide can be formed using electron cyclotron resonance (ECR) plasma deposition.

For example, to form a novel $SiO_2$ protective layer 20 layer, oxygen should be fed into the plasma formation chamber at a rate from about 15 standard cubic centimeters per minute (sccm) to about 300 sccm and silane into the deposition chamber, at a rate of from about 15 sccm to about 300 sccm and argon at a rate about 0 sccm, while maintaining the temperature in the deposition chamber at from about 25° C. to about 400° C. and a pressure ranging from about 0.005 to about 200 millitorr. The magnetic flux density of the magnet used to provide the electron cyclotron resonance in the plasma formation chamber should be about 800 to 900 gauss and preferably about 875 gauss while the microwave frequency used to form the plasma should range from about 12.56 to 14.56 MHz and more preferably about 13.56 Mhz. The process can be performed in any convention high density Plasma Chemical vapor deposition reactor such as an Epic high density plasma CVD Chamber by Lam research.

In the preferred process to formed the ECR oxide protective layer has an oxygen flow rate into the plasma formation chamber at a rate of from about 105 standard cubic centimeters per minute (sccm) to about 145 sccm and more preferably about 125 sccms; an argon flow rate of about 0 sccm and more preferably about 0 sccm; and a silane flow in the range between about 60 to 80 sccm and more preferably about 70 sccm; and a magnetic flux density in the range between about 850 to 900 gauss and more preferably about 875 gauss; and a rf frequency in the range between about 12.50 to 14.50 MHz and more preferably about 13.50 MHz; and a rf power in the range between about 1150 to 1350 watts and more preferably about 1250 watts; and a deposition pressure in the range between about 3 to 7 torr and more preferably about 5 torr; and a deposition temperature in the range between about 250° to 400 ° C. and more preferably about 300° C.; and deposition time in the range between about 3 to 5 minutes and more preferably about 4 minutes. These preferred process parameters used to form silicon oxide protective layer 20 are shown below in table 1.

TABLE 1

Process Parameters for the Preferred ECR Oxide Protective Layer (approximate values (+/− 10%))

|  | target | Low | high |
| --- | --- | --- | --- |
| Protective layer thickness | 1500Å | 1000Å | 2000Å |
| argon flow rate (SCCM) | 0 | 0 | 0 |
| Silane flow | 70 | 60 | 80 |
| $O_2$ flow | 125 | 105 | 145 |
| Magnetic flux density *(gauss) | 875 | 850 | 950 |
| RF frequency (gHz) | 13.50 | 12.50 | 14.50 |
| RF power (watts) | 1250 | 1150 | 1350 |
| Pressure (mTorr) | 5 | 3 | 7 |
| Deposition temperature (°C.) | 300 | 250 | 400 |
| deposition time (min) | 4 | 3 | 5 |

Next, as shown in FIG. 3, a gap-fill oxide layer 22 is formed over the protective layer 10. The gap fill oxide layer 22, in contrast to the novel protective layer 20, is formed by an ECR oxide technique with an argon flow. The argon and rf power enhance the etch characteristics of the gap fill layer. The gap fill ECR step parameters are set so that etching associated with the gap-fill layer will not etch through the protective layer 20 and will not expose the metal lines 14, but will fill in between tightly spaced lines and have good planarization. The gap fill has a thickness in the range between about 1000 to 2000 Å and more preferably about 1500 Å.

The gap-fill layer 22 can be formed of silicon oxide, doped silicon oxide, silicon nitride or silicon oxynitride using ECR processes with Argon flows and rf power. The dielectric layer is preferably formed of silicon dioxide. An insulating layer composed of silicon oxide can be formed using electron cyclotron resonance (ECR) plasma deposition as described in U.S. Pat. No. 4,962,063, Maydan et al to which cross reference is hereby made.

In a method to form a $SiO_2$ insulating layer, oxygen should be fed into the plasma formation chamber at a rate of from about 15 standard cubic centimeters per minute (sccm) to about 300 sccm and silane into the deposition chamber, at a rate of from about 15 sccm to about 300 sccm and argon at a rate between about 80 to 1000 sccm and preferably between about 80 to 100 sccms and more preferably 90 sccm, while maintaining the temperature in the deposition chamber at from about 25° C. to about 400° C. and a pressure ranging from about 0.005 to about 200 Millitorr. The process can be performed in any convention high density Plasma chemical vapor deposition reactor such as an Epic high density plasma CVD Chamber by Lain research. The magnetic flux density of the magnet used to provide the electron cyclotron resonance in the plasma formation chamber should range from about 500 to 2500 gauss while the microwave frequency used to form the plasma should range from about 1 to about 4 gHz. A plasma power level of from about 100 to about 1500 Watts should be used. For example, when the magnetic flux density is 875 gauss, the microwave frequency should be about 2.45 gHz. The ECR plasma deposition parameter are preferably adjusted to provide an aspect ratio (depth to width) of at least 1 and preferably as high as 3.

The preferred ECR oxide gap filling layer has a thickness in the range between about 1000 to 2000 Å and more preferably about 1500 Å. The preferred ECR oxide gap filling process parameters are summarized below in Table 2.

The preferred ECR oxide gap filling layer process has an oxygen flow rate (fed into the plasma formation chamber) between about 105 standard cubic centimeters per minute (sccm) to about 145 sccm and more preferably about 125 sccms; an argon flow rate in the range between about 80 to 1000 sccm preferably between about 80 to 100 sccms and more preferably about 90 sccm; and a silane flow in the range between about 60 to 80 sccm and more preferably about 70 sccm; and a magnetic flux density in the range between about 850 to 900 gauss and more preferably about 875 gauss; and a rf frequency in the range between about 12.50 to 14.50 MHz and more preferably about 13.50 MHz; and a rf power in the range between about 1150 to 1350 watts and more preferably about 1250 watts; and a deposition pressure in the range between about 3 to 7 torr and more preferably about 5 torr; and a deposition temperature in the range between about 250° to 400° C. and more preferably about 300° C.; and deposition time in the range between about 3 to 5 minutes and more preferably about 4 minutes. The preferred metallurgy line spacing is between about 0.25 to 0.55 μm and preferably about 0.4 μm and a line width in the range between about 0.4 to 0.6 μm and more preferably about 0.3 μm. The process parameters for the preferred ECR silicon oxide gap filling layer are shown below in Table 2.

TABLE 2

Process Parameters for the Preferred ECR Oxide Gap Filling Layer (approximate values (+/- 10%))

| | target | Low | high |
|---|---|---|---|
| gap fill layer thickness | 1500Å | 1000Å | 2000Å |
| argon flow rate (SCCM) | 90 | 80 | 1000 |
| Silane flow | 70 | 60 | 80 |
| $O_2$ flow | 125 | 105 | 145 |
| Magnetic flux density *(gauss) | 875 | 850 | 950 |
| RF frequency (gHz) | 13.50 | 12.50 | 14.50 |
| RF power (watts) | 1250 | 1150 | 1350 |
| Pressure (mTorr) | 5 | 3 | 7 |
| Deposition temperature (°C.) | 300 | 250 | 400 |
| deposition time (min) | 4 | 3 | 5 |
| Line width (μm) | 0.3 | 0.1 | 1.0 |
| Line height (μm) | 0.5 | 0.25 | 1 |
| Aspect ratio | 1.7 | 1 | 3 |

Figure 6:
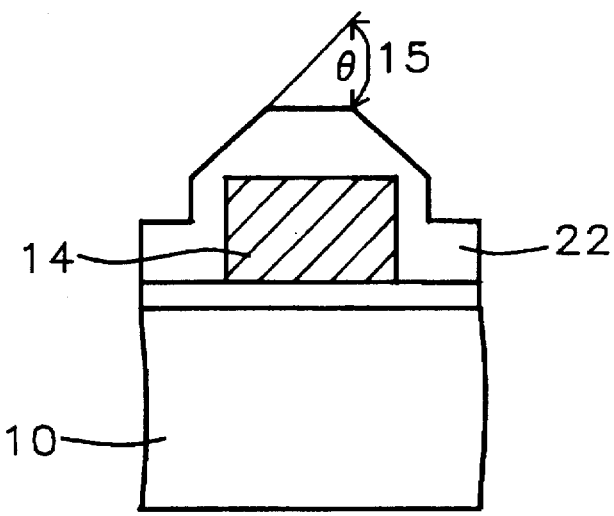
FIG. 6 is a cross sectional view of the dielectric layer of the present invention for illustrating the effects of the etch to deposit ratio of the gap fill ECR oxide process.
Figure 7:
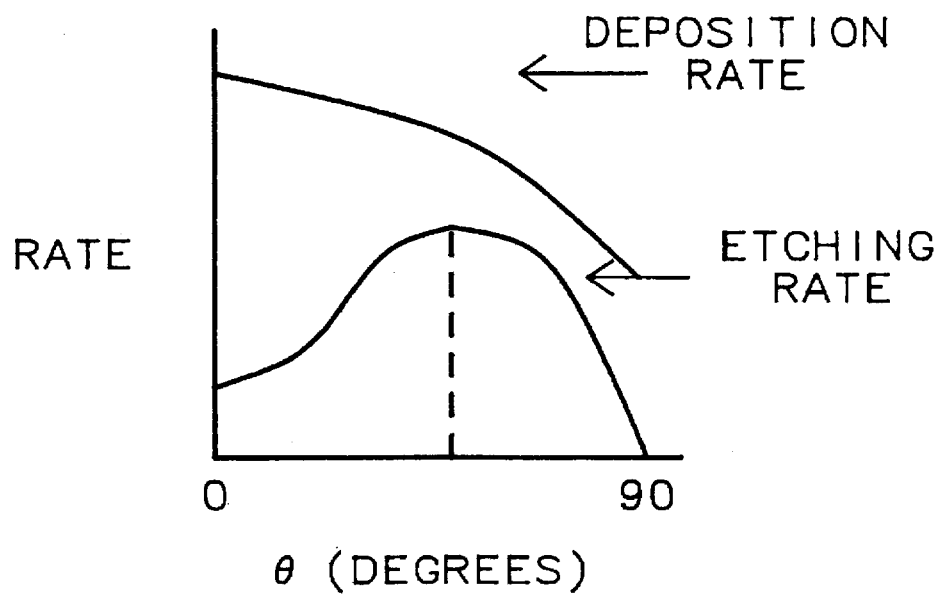
FIG. 7 is a graph showing the relationship between the etch and deposition rates of the gap fill layer as a function of angle Ø from the deposition/etch surface.

The etch component of the ECR gap fill deposition process can be controlled by adjusting the rf power and the argon flow rate to maintain a desired etch to deposition ratio to protect the metallurgy lines from excessive attack. The argon gas, when used with sufficient rf power, etches the protective layer 20 and the metallurgy lines 14. FIG. 7 shows the deposition and etch rates of the gap fill layer 22 (i.e., having an argon flow) as a function of the angle Ø(15) as shown in FIG. 6. Both the etch and deposition rate are a function of the angle Ø of the surface. This is why the gap fill layer 22 is thin on the vertical sidewalls of the metallurgy lines 14 and thicker on the flat surfaces of the substrate and top of the lines 14 as shown in FIG. 4. The etch rate peaks at about 45° and the deposition rate declines as the angle Ø increases. The etch to deposition rate is given by the equation:

$$\text{Etch to Deposition ratio} = \frac{R(rf=0) - R(rf,\emptyset)}{R(rf=0)}$$

Where:
R(rf=0)=deposition rate at radio frequency bias equals zero
R(rf,Ø)=deposition rate at the radio frequency bias and deposition angle Ø.

The gap fill ECR process of the present invention has an Etch to deposition (E/D) ratio in the range between about 30 to 40% and more preferably about 35%. This ensures that the protective layer 20 over metallurgy lines is not etched through as shown in FIGS. 2 through 4.

Experiments has shown that the damage (as measured by (Gm) transconducance degradation) caused to conductive lines 14 by the high density plasma deposition processes increases as the microwave power increases and as the bottom RF power increases. Also, the high density plasma damage to the conductor can be reduced by increasing the protective layer 20 thickness. While the mechanisms are not known for certain, the following are proposed mechanisms for the high density plasma (HDP) damage. First, the HDP chemical vapor deposition (CVD) processes, including enhanced cyclotron resonance (ECR) chemical vapor deposition (CVD) process have in situ deposition/etch (sputtering) characteristics. The direct sputtering on conductors (metal lines) will induce serious "antenna effects" which damage the gate dielectric and degrade Gm. Higher microwave power will generate high ion energy and further increase the "antenna effect" cause more damage to the conductor. The protective layers 20 24 protect the metallurgy lines from the damaging sputtering effects of the ECR (w/argon flow) gap fill layers.

The protective layer and gap fill layer steps, as explained above, are repeated until the desired overall thickness of protective layer 20 24 and gap fill layer 22 are formed. The overall thickness of protective layers and gap fill layers is between about 5000 to 10,000 Å and more preferably about 7500 Å.

Subsequently, a capping gap fill layer (top gap filling layer) 26 is formed having a thickness in the range between about 5000 to 6000 Å. A capping protective layer (top protective layer) is then preferably formed having a thickness in the range between about 8000 to 12,000 Å. The capping gap fill layer and protective layer planarize the underlying layers.

Figure 5:
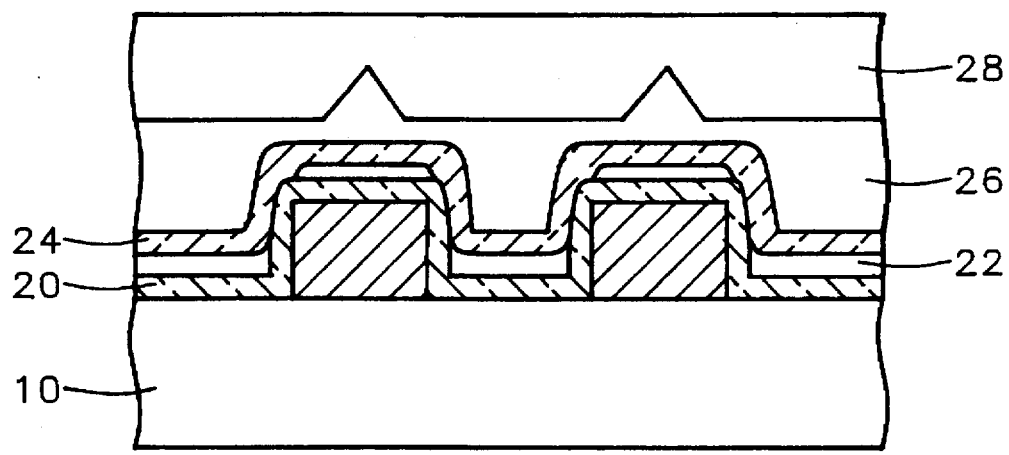

The preferred process includes a total of three protective layer and two gap fill layers (alternating layers. e.g., protective, gap fill, protective, gap fill, protective) with an overall thickness in the range between about 5000 to 10,000 Å (not all layers shown in the figs). This sequence of protective and gap fill layers is followed by a capping gap fill layer 26 with a thickness in the range between about 5000 to 6000 Å and a capping protective layer 28 with a thickness in the range between about 8000 to 12,000 Å as shown in FIGS. 4 and 5.

The capping gap fill layer and capping protective layer complete the planarization. Next, additional metallurgy layers and insulating layers can be formed over the capping layer and the metallurgy lines connected to form a semiconductor device.

The multi step in situ ECR oxide process of the invention forms dielectric oxide layers between closely spaced fines without damaging the lines. The multi step in situ process allows the oxide to be formed between closely spaced lines using the ECR oxide process, but prevents the damage to the metallurgy lines. The process is inexpensive, simple to implement and increases device yields.

While the invention has been particularly shown and described with reference to the preferred embodiments thereof, it will be understood by those skilled in the art that various changes in form and details may be made without departing from the spirit and scope of the invention.

What is claimed is:

1. A method for forming an inter metal dielectric layer between closely spaced metallurgy lines on a semiconductor surface comprising:
   (a) providing a semiconductor substrate with closely spaced metallurgy lines thereon;
   (b) encapsulating said substrate and said metallurgy lines with a protective oxide layer; said protective oxide layer formed by an electro cyclotron resonance technique with no argon flow; said protective layer having a thickness in the range between about 1000 and 2000 Å;
   (c) forming a gap fill oxide layer over said protective layer; said gap fill oxide layer formed by an electro cyclotron resonance (ECR) technique with an argon flow and a rf power; the formation of said gap-fill layer not exposing said metallurgy lines; said gap filled layer having a thickness in the range between about 1000 and 2000 Å; and
   (d) repeating steps (b) and (c) until the desired thickness of said gap fill layers and said protective layers are formed.

2. The method of claim 1 which further includes forming a capping gap fill layer having a thickness in the range between about 5000 to 6000 Å and a capping protective layer having a thickness in the range between about 8000 to 12,000 Å.

3. The method of claim 1 wherein a total of three protective layers and two gap fill layers with an overall thickness in the range between about 5000 to 10,000 Å are formed over said metallurgy lines; and
   forming a capping gap fill layer, with an ECR technique with an argon flow, over said three protective layers and said two gap fill layers; said capping gap fill layer having a thickness in the range between about 5000 to 6000 Å; and
   forming a capping protective layer, with an ECR technique with no argon flow, over said capping gap fill layer; said capping protective layer having a thickness in the range between about 8000 to 12,000 Å.

4. The method of claim 1 wherein said metallurgy lines are formed of a material selected from the group consisting of tungsten, AlSiCu and AlCu.

5. The method of claim 1 which further includes before step (a), covering said metallurgy lines with a titanium nitride layer having a thickness in the range between about 750 to 1400 Å.

6. The method of claim 1 wherein the closely spaced metallurgy lines are formed of AlCu and the metallurgy fines are covered with a titanium nitride layer having a thickness in the range between about 250 to 1400 Å.

7. The method of claim 1 wherein said ECR oxide technique used to form said gap fill has an Etch to deposition (E/D) ratio in the range between about 30 to 40%.

8. The method of claim 1 wherein said ECR oxide technique used to form said protective layer has an oxygen flow rate from about 105 to 145 sccm; and a silane flow in the range between about 60 to 80 sccm; and a magnetic flux density in the range between about 850 to 900 gauss; and a rf frequency in the range between about 12.50 to 14.50 MHz; and a rf power in the range between about 1150 to 1350 watts; and a deposition pressure in the range between about 3 to 7 torr; and a deposition temperature in the range between about 250° to 400° C.; and deposition time in the range between about 3 to 5 minutes.

9. The method of claim 1 wherein said ECR oxide technique used to form said gap fill layer has an oxygen flow rate from about 105 to 145 sccm; an argon flow rate in the range between about 80 to 100 sccm; and a silane flow in the range between about 60 to 80 sccm; and a magnetic flux density in the range between about 850 to 900 gauss; and a rf frequency in the range between about 12.50 to 14.50 MHz; and a rf power in the range between about 1150 to 1350 watts; and a deposition pressure in the range between about 3 to 7 torr; and a deposition temperature in the range between about 250° to 400° C.; and deposition time in the range between about 3 to 5 minutes.

10. The method of claim 1 wherein said protective oxide layer is formed of a material selected from the group consisting of: silicon nitride, silicon oxynitride and doped silicon oxide.

11. The method of claim 1 wherein said gap filling layer is formed of a material selected from the group consisting of: silicon nitride, silicon oxynitride and doped silicon oxide.

12. A method for forming an inter metal dielectric layer between closely spaced metallurgy lines on a semiconductor surface comprising:
   (a) providing a semiconductor substrate with closely spaced metallurgy lines thereon;
   (b) encapsulating said substrate and said metallurgy lines with a protective oxide layer; said protective oxide layer formed by an electro cyclotron resonance technique with no argon flow; said protective oxide layer having a thickness in the range between about 1000 to 2000 Å;

(c) forming a gap fill oxide layer over said oxide protective layer; said gap fill oxide layer formed by an ECR oxide technique with an argon flow and a rf power; the formation of said gap-fill layer not exposing said metallurgy lines; said gap filled layer having a thickness in the range between about 1000 to 2000 Å;

(d) repeating steps (b) and (e) until the desired thickness of said gap fill and said protective layer are formed;

(e) forming a capping gap fill layer over the protective layers and gap fill layers, using an ECR technique with an argon flow; said capping gap fill layer having a thickness in the range between about 5000 to 6000 Å; and (f) forming a capping protective layer using an ECR technique without an argon flow, over said capping gap fill layer; said capping protective layer having a thickness in the range between about 8000 to 12,000 Å.

13. The method of claim 12 wherein a total of three protective layers and two gap fill layers with an overall thickness in the range between about 5000 to 10,000 Å are formed over said metallurgy lines; and forming a capping gap fill layer over said three protective layers and said two gap fill layers; said capping gap fill layer having a thickness in the range between about 5000 to 6000 Å; and forming a capping protective layer over said capping gap fill layer; said capping protective layer having a thickness in the range between about 8000 to 12,000 Å.

14. The method of claim 12 wherein said metallurgy lines are formed of a material selected from the group consisting of: tungsten, AlSiCu and AlCu.

15. The method of claim 12 which further includes before step (a), covering said metallurgy lines with a titanium nitride layer having a thickness in the range between about 750 to 1400 Å.

16. The method of claim 12 wherein the closely spaced metallurgy lines are formed of AlCu and the metallurgy lines are covered with a titanium nitride layer having a thickness in the range between about 250 to 1400 Å.

17. The method of claim 12 wherein said ECR oxide technique used to form said protective layer has an oxygen flow rate from about 105 to 145 sccm; and a silane flow in the range between about 60 to 80 sccm; and a magnetic flux density in the range between about 850 to 900 gauss; and a rf frequency in the range between about 12.50 to 14.50 MHz; and a rf power in the range between about 1150 to 1350 watts; and a deposition pressure in the range between about 3 to 7 torr; and a deposition temperature in the range between about 250° to 400° C.; and deposition time in the range between about 3 to 5 minutes.

18. The method of claim 12 wherein said ECR oxide technique used to form said gap fill layer has an oxygen flow rate from about 105 standard cubic centimeters per minute (sccm) to 145 sccm; an argon flow rate in the range between about 80 to 100 sccm; and a silane flow in the range between about 60 to 80 sccm; and a magnetic flux density in the range between about 850 to 900 gauss; and a rf frequency in the range between about 12.50 to 14.50 MHz; and a rf power in the range between about 1150 to 1350 watts; and a deposition pressure in the range between about 3 to 7 torr; and a deposition temperature in the range between about 250° to 400° C.; and deposition time in the range between about 3 to 5 minutes.

19. The method of claim 12 wherein said protective oxide layer is formed of a material selected from the group consisting of: silicon nitride, silicon oxynitride and doped silicon oxide.

20. The method of claim 12 wherein said gap filling layer is formed of a material selected from the group consisting of: silicon nitride, silicon oxynitride and doped silicon oxide.

21. A method for forming an inter metal dielectric layer between closely spaced metallurgy lines on a semiconductor surface comprising:

(a) providing a semiconductor substrate with closely spaced metallurgy lines thereon;

(b) encapsulating said substrate and said metallurgy lines with a protective oxide layer; said protective oxide layer formed by an electro cyclotron resonance technique with no argon flow; said protective layer having a thickness in the range between about 1000 and 2000 Å;

(c) forming a gap fill oxide layer over said protective layer; said gap fill oxide layer formed by an electro cyclotron resonance (ECR) technique with an argon flow and a rf power; the formation of said gap-fill layer not exposing said metallurgy lines; said gap filled layer having a thickness in the range between about 1000 and 2000 Å; said electron cyclotron resonance (ECR) technique used to form said gap fill oxide layer having an Etch to deposition (E/D) ratio in the range between about 30 and 40%; and (d) repeating steps (b) and (c) until the desired thickness of said gap fill layers and said protective layers are formed.

22. The method of claim 21 which further includes forming a capping gap fill layer having a thickness in the range between about 5000 and 6000 Å and a capping protective layer having a thickness in the range between about 8000 and 12,000 Å.

23. The method of claim 22 which further includes before step (a), covering said metallurgy lines with a titanium nitride layer having a thickness in the range between about 750 and 1400 Å.

24. The method of claim 22 wherein the closely spaced metallurgy lines are formed of AlCu and the metallurgy lines are covered with a titanium nitride layer having a thickness in the range between about 750 and 1400 Å.

25. The method of claim 23 wherein a total of three protective layers and two gap fill layers with an overall thickness in the range between about 5000 and 10,000 Å are formed over said metallurgy lines; and forming a capping gap fill layer, using an ECR technique with an argon flow, over said three protective layers and said two gap fill layers; said capping gap fill layer having a thickness in the range between about 5000 and 6000 Å; and forming a capping protective layer, using an ECR technique with no argon flow, over said capping gap fill layer; said capping protective layer having a thickness in the range between about 8000 and 12,000 Å.

26. The method of claim 23 wherein said metallurgy lines are formed of a material selected from the group consisting of: tungsten, AlSiCu and AlCu.

27. The method of claim 24 wherein said ECR oxide technique used to form said protective layer has an oxygen flow rate from between about 105 and 145 sccm; and a silane flow in the range between about 60 and 80 sccm; and a magnetic flux density in the range between about 850 and 900 gauss; and a rf frequency in the range between about 12.50 and 14.50 MHz; and a rf power in the range between about 1150 and 1350 watts; and a deposition pressure in the range between about 3 and 7 torr; and a deposition temperature in the range between about 250° and 400° C.; and deposition time in the range between about 3 and 5 minutes.

28. The method of claim 22 wherein said ECR oxide technique used to form said gap fill layer has an oxygen flow rate from between about 105 and 145 sccm; an argon flow rate in the range between about 80 and 100 sccm; and a silane flow in the range between about 60 and 80 sccm; and a magnetic flux density in the range between about 850 and 900 gauss; and a rf frequency in the range between about 12.50 and 14.50 MHz; and a rf power in the range between about 1150 and 1350 watts; and a deposition pressure in the range between about 3 and 7 torr; and a deposition temperature in the range between about 250° and 400° C.; and deposition time in the range between about 3 and 5 minutes.

29. The method of claim 22 wherein said protective oxide layer is formed of a material selected from the group consisting of: silicon nitride, silicon oxynitride and doped silicon oxide.

30. The method of claim 22 wherein said gap filling layer is formed of a material selected from the group consisting of: silicon nitride, silicon oxynitride and doped silicon oxide.

31. A method for forming an inter metal dielectric layer between closely spaced metallurgy lines on a semiconductor surface comprising:

(a) providing a semiconductor substrate with closely spaced metallurgy lines thereon;

(b) encapsulating said substrate and said metallurgy lines with a protective oxide layer; said protective oxide layer formed by an electro cyclotron resonance technique with no argon flow;

(c) forming a gap fill oxide layer over said protective layer; said gap fill oxide layer formed by an electro cyclotron resonance (ECR) technique with an argon flow and a rf power; the formation of said gap-fill layer not exposing said metallurgy lines;

(d) repeating steps (b) and (c) for a total of three protective layers and two gap fill layers with an overall thickness in the range between about 5000 and 10,000 Å are formed over said metallurgy lines;

(f) forming a capping gap fill layer, with an ECR technique with an argon flow, over said three protective layers and said two gap fill layers; said capping gap fill layer having a thickness in the range between about 5000 and 6000 Å; and (g) forming a capping protective layer, with an ECR technique with no argon flow, over said capping gap fill layer; said capping protective layer having a thickness in the range between about 8000 and 12,000 Å.

* * * * *

UNITED STATES PATENT AND TRADEMARK OFFICE
CERTIFICATE OF CORRECTION

PATENT NO. : 5,679,606  
DATED : 10/21/97  
INVENTOR(S) : Chin-Kun Wang, Chen-Hua Douglas Yu, Lu-Min Liu It is certified that error appears in the above-indentified patent and that said Letters Patent is hereby corrected as shown below:

On the title page, item (75)  
chang "Lu-Min Lin" to --Lu-Min Liu--

Signed and Sealed this

Sixth Day of January, 1998

Attest:

BRUCE LEHMAN

*Attesting Officer*  *Commissioner of Patents and Trademarks*